(12) United States Patent
Pan

(10) Patent No.: US 11,817,342 B2
(45) Date of Patent: Nov. 14, 2023

(54) WAFER CARRIER, WAFER ACCESS DEVICE AND WAFER CARRIER AND ACCESS ASSEMBLY HAVING THE SAME

(71) Applicant: DLY TECHNOLOGIES INC., Kaohsiung (TW)

(72) Inventor: Shih Feng Pan, Donggang Township, Pingtung County (TW)

(73) Assignee: DLY TECHNOLOGIES INC., Kaohsiung (TW)

( * ) Notice: Subject to any disclaimer, the term of this patent is extended or adjusted under 35 U.S.C. 154(b) by 0 days.

(21) Appl. No.: 17/972,946

(22) Filed: Oct. 25, 2022

(65) Prior Publication Data

US 2023/0128509 A1   Apr. 27, 2023

(30) Foreign Application Priority Data

Oct. 25, 2021   (CN) .......................... 202111240012.8

(51) Int. Cl.
*H01L 21/677* (2006.01)
*H01L 21/687* (2006.01)

(52) U.S. Cl.
CPC .. *H01L 21/68707* (2013.01); *H01L 21/67766* (2013.01); *H01L 21/67781* (2013.01)

(58) Field of Classification Search
CPC ................ B25J 9/043; H01L 21/68707; H01L 21/67742
See application file for complete search history.

(56) References Cited

U.S. PATENT DOCUMENTS

| | | | | |
|---|---|---|---|---|
| 5,273,244 A | * | 12/1993 | Ono | ................... H01L 21/67781 211/1.57 |
| 5,562,387 A | * | 10/1996 | Ishii | ................... H01L 21/67781 414/217 |
| 5,655,871 A | * | 8/1997 | Ishii | ................... H01L 21/67781 414/941 |
| 6,293,749 B1 | | 9/2001 | Raaijmakers et al. | |
| 8,277,165 B2 | | 10/2012 | Tabrizi et al. | |
| 8,473,096 B2 | | 6/2013 | Matsuo et al. | |

(Continued)

FOREIGN PATENT DOCUMENTS

JP   2004130459 A   4/2004
JP   2008135630 A   6/2008

(Continued)

*Primary Examiner* — Gerald McClain
(74) *Attorney, Agent, or Firm* — Muncy, Geissler, Olds & Lowe, P.C.

(57) ABSTRACT

A wafer access assembly, a wafer access device and a wafer carrier are provided. The wafer access device includes a base, a shaft, a plurality of couple plates, a plurality of arms, and a stretchable component. The base includes a groove. The shaft extends into the groove and is capable of sliding into the groove. The plurality of couple plates mounting on the shaft. Each of the plurality of couple plates includes a plate body and a through hole on the plate body for the shaft passing through. Each of the plurality of arms is extended from an end of each of the plurality of couple plates. The stretchable component includes a plurality of connecting side walls connecting adjacent couple plates together. The plurality of stretchable component are capable of changing a distance between adjacent couple plates.

10 Claims, 7 Drawing Sheets

(56) References Cited

U.S. PATENT DOCUMENTS

| | | | |
|---|---|---|---|
| 8,641,350 B2 | 2/2014 | de Ridder | |
| 8,950,998 B2 | 2/2015 | van der Meulen | |
| 9,371,196 B2* | 6/2016 | Zhu | B65G 49/061 |
| 9,878,453 B2 | 1/2018 | Bonora | |
| 2017/0352556 A1* | 12/2017 | Komae | H01L 21/67781 |
| 2021/0050242 A1* | 2/2021 | Sakata | H01L 21/67778 |
| 2021/0108363 A1 | 4/2021 | Kaneta et al. | |
| 2021/0391191 A1* | 12/2021 | Pan | H01L 21/67706 |
| 2022/0093444 A1* | 3/2022 | Kuribayashi | B25J 11/0095 |

FOREIGN PATENT DOCUMENTS

| | | | |
|---|---|---|---|
| JP | 2010179420 A | * | 8/2010 |
| TW | 201839889 A | | 11/2018 |
| WO | WO2015045618 A1 | | 4/2015 |

\* cited by examiner

WAFER CARRIER, WAFER ACCESS DEVICE AND WAFER CARRIER AND ACCESS ASSEMBLY HAVING THE SAME

CROSS-REFERENCE TO RELATED APPLICATION

This application claims the priority benefit of China application No. 202111240012.8, filed 2021 Oct. 25. The entirety of each of the above-mentioned patent applications is hereby incorporated by reference herein and made a part of this specification.

TECHNICAL FIELD

This application is related to a wafer access and transport device, especially for a wafer access assembly and its wafer access device and wafer carrier with time saving and transport volume reduction characteristics.

BACKGROUND

A wafer is a main substrate material for a semiconductor process. Because the wafer is fragile, and when a wafer undergone the exposure, development, and etching processes is polluted, the loss is staggering. Therefore, a special designed sealed container is usually required to protect the wafer in transportation. Currently, a wafer robot is used to move a wafer between a wafer box and a wafer transporting system, to be adapted for equipment in a manufacturing line, a distance between two adjacent slits of the wafer box is about 10 mm, so as to define a viable volume of a wafer box for 25 wafers. On the other hand, the robot is only able to grab and move one wafer between a wafer box and a wafer transporting system, thus the transportation efficiency is low. When a large quantity of wafers are needed to be transported between factories, it would cost large storage volume, more transport time and a viable transport cost.

SUMMARY

Therefore, one purpose of the invention is to provide a wafer access assembly and its wafer access device and wafer carrier with a high wafer access efficiency and substantially reduce the volume of the wafer carrier when transporting the wafers.

For the aforementioned purpose, the invention discloses a base, a shaft, a plurality of couple plates, a plurality of arms, and a stretchable component, the base comprising a groove, the shaft extends into the groove and is capable of sliding in the groove, the plurality of couple plates mounting on the shaft, each of the plurality of couple plates comprising a plate body and a through hole on the plate body for the shaft passing through, each of the plurality of arms being extended from an end of each of the plurality of couple plates, the stretchable component comprising a plurality of connecting side walls connecting adjacent couple plates together, the plurality of stretchable component being capable of changing a distance between adjacent couple plates.

For the aforementioned purpose, the invention discloses a wafer carrier, used for any embodiment of the wafer access device to move the wafer in and out of the wafer carrier, the wafer carrier comprises a plurality of slots.

For the aforementioned purpose, the invention discloses a wafer access assembly, comprises any embodiment of the wafer access device and any embodiment of the wafer carrier, the wafer access device moves the wafer in and out of the wafer carrier.

As a result, the volume of the wafer carrier carrying wafers is reduced by half as compared to the current structure, especially for transportation between factories, the occupied storage volume is also half of the current technology; On the other hand, because the wafer access device comprises a plurality of arms, it can vacuum adsorbing a plurality of wafers for transportation simultaneously, as compared to the current conventional robot only being capable of grabbing one wafer at a time, the wafer access device of the invention can reduce the time of vacuum absorption and transportation, thus a higher wafer access efficiency can be achieved.

DETAILED DESCRIPTION

Figure 1:
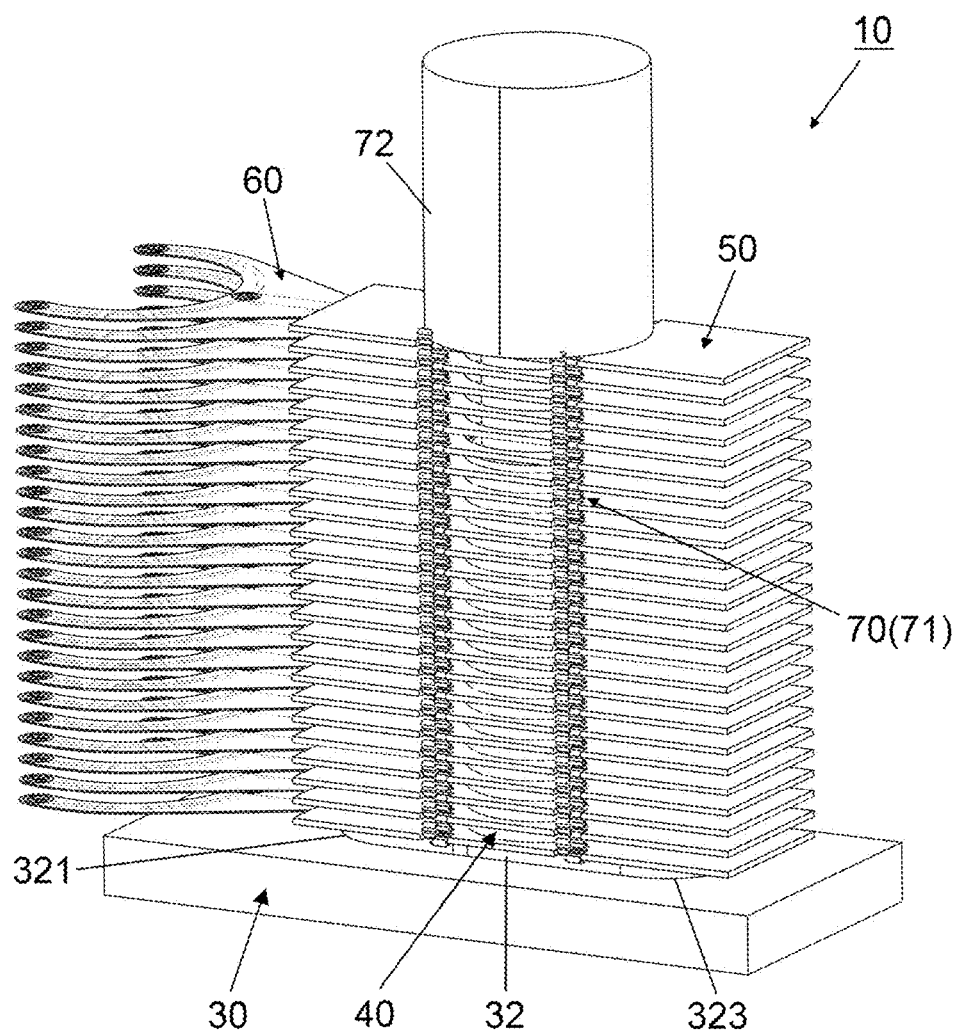
FIG. 1 is a perspective view of a wafer access device according to a preferred embodiment of the present invention.
Figure 2:
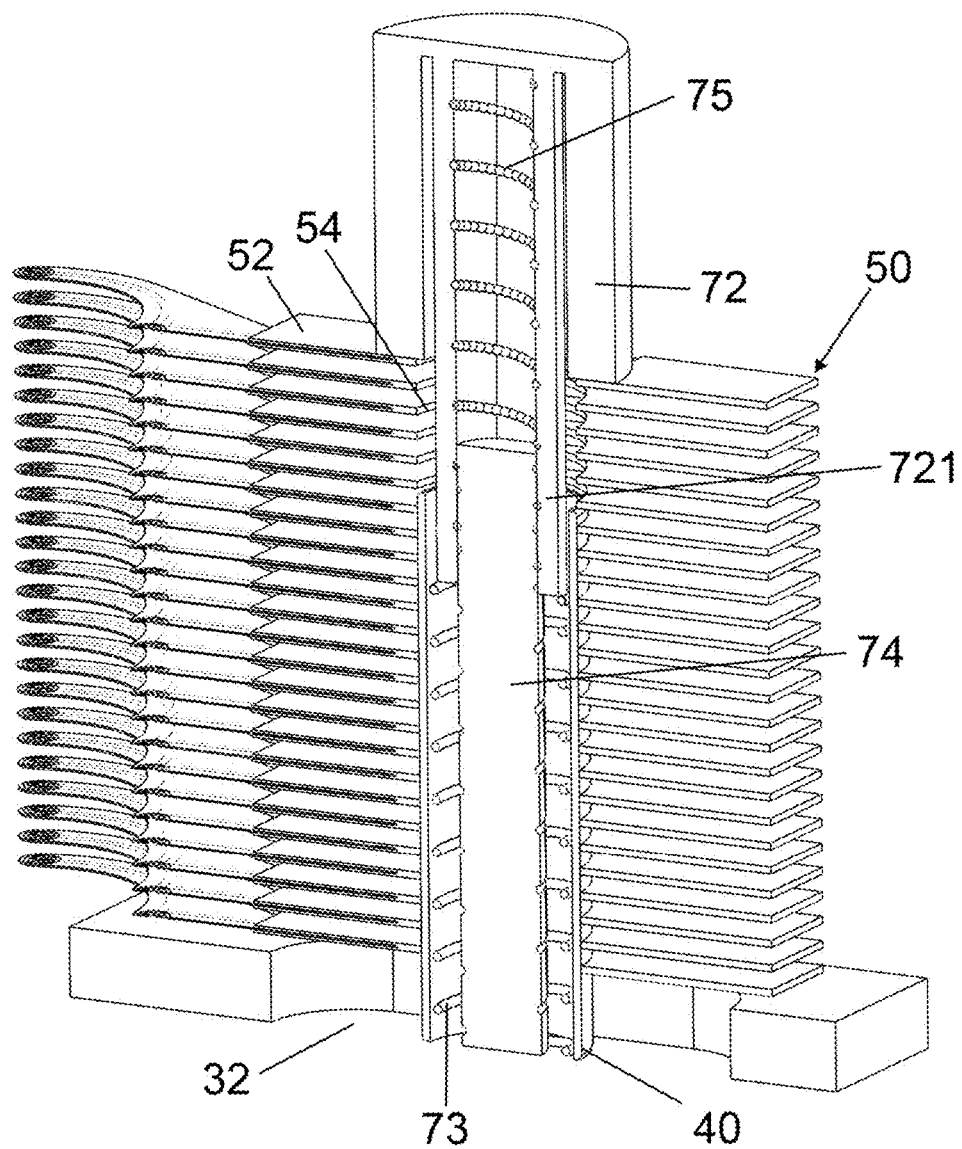
FIG. 2 is a cross-sectional view of a wafer access device according to a preferred embodiment of the present invention.

FIG. 1 and FIG. 2 illustrate a wafer access device 10 according to a preferred embodiment of the invention, which comprises a base 30, shaft 40, a plurality of couple plates 50, a plurality of arms 60, and a stretchable component 70.

The base 30 comprises a groove 32, the groove 32 comprises a first end 321 and a second end 323, the base 30 is capable of shifting or rotating, and the shaft 40 extends into the groove 32 and is capable of sliding in the groove 32.

The plurality of couple plates 50 are mounted on the shaft 40, each couple plate 50 comprises a plate body 52 and a through hole 54 penetrated through the plate body 52, each through hole 54 is passed through by the shaft 40 so that each couple plate 50 is mounted on the shaft 40. In this embodiment, the quantity of the plurality of couple plate 50 is 25, and in other embodiments, the quantity of the plurality of couple plate 50 could be changed as required.

Each arm extends from one end of the plate body 52 of each of the couple plate 50, therefore, the quantity of the arms 60 is equal to the quantity of the couple plates 50. In this embodiment, the quantity of the arms 60 is also 25. Each arm 60 is used to vacuum absorb a wafer W.

Figure 3:
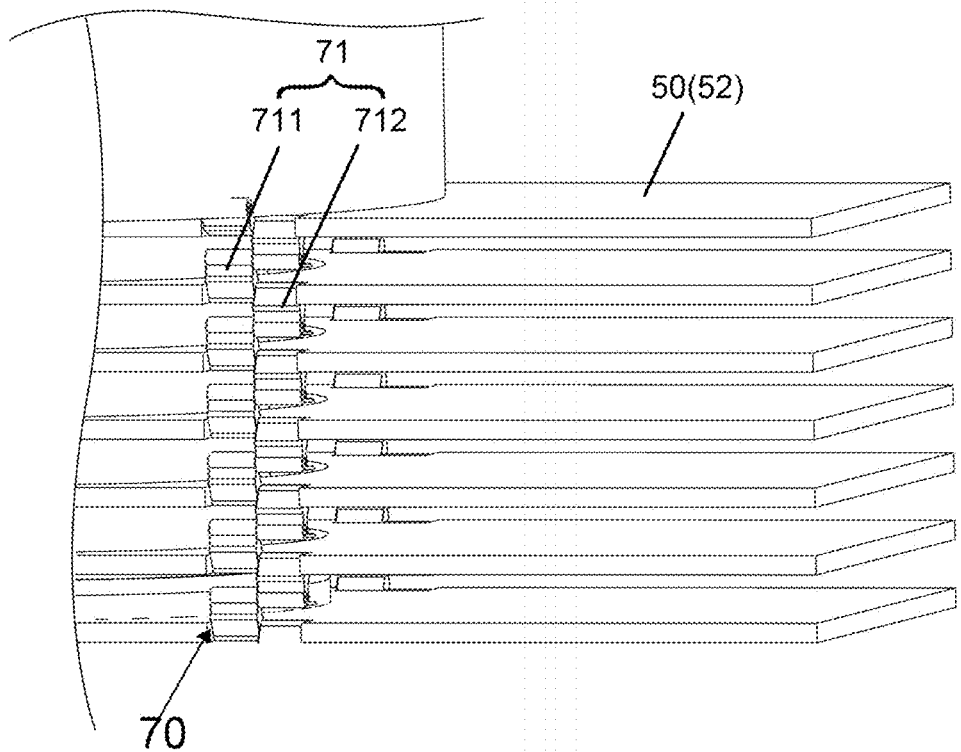
FIG. 3 is a part of a perspective view of a wafer access device according to a preferred embodiment of the present invention.

The stretchable component 70 comprises a plurality of connecting side walls 71 set on the plurality of the couple plates 50 and connecting the adjacent couple plates 50 together; a driving block 72 is mounted on the shaft 40 and capable of being movable upwardly and downwardly; a elastic unit 73 set inside the shaft 40 and stick to the driving block 72; and a stud 74 is accommodated within the shaft 40;

The plurality of connecting side walls 71 stretchable to change a distance between adjacent couple plates, when the plurality of connecting side walls 71 being in a stretched status, the distance between adjacent couple plates is largest, and when the plurality of connecting side walls 71 being in a compressed status, the distance between adjacent couple plates is minimum. In this embodiment as shown in FIG. 3, the connecting side walls 71 comprises a first side wall 711 and a second side wall 712 pivotally connected with the first side wall 711, and the first side wall 711 and the second side wall 712 are pivotally connected to the plate body 52 of the same couple plate 50, and the second side walls 712 of each couple plate 50 are simultaneously connected to the first side walls 711 of the adjacent couple plates 50. When the plurality of first side walls 711 and the plurality of second side walls 712 are adjusted from a stretched status to a compressed status, the distance between two adjacent plate bodies 52 of two adjacent couple plates 50 is shorten accordingly.

The driving block 72 is connected to the topmost couple plate 50, and is capable of driving the couple plate 50 upwardly or downwardly. The driving block 72 comprises a bushing 721 that extending into the shaft 40 and being located between the shaft 40 and the stud 74. The stud 74 could rotates to drive the driving block 72 move upwardly or downwardly. Besides, the stretchable component 70 comprises a plurality of balls 75 which set between the bushing 721 and stud 74, in other words, the inner side of the bushing 721 and the outer side of the stud 74 comprise indentions containing the plurality of balls 75 and for rolling therein. By stretching of the plurality of connecting side walls 71, when the distance between two adjacent plate bodies 52 increases, it will facilitate the access of the supporting substrates, such as wafers; when the distance between two adjacent plate bodies 52 decreases, it will reduce the total volume of the wafer access device 10 efficiently so as to save the operating space. The structure of the stretchable component 70 can be changed in will by stretching to change the distance between plate bodies 52.

The driving block 72 can stretch a plurality of connecting side walls 71. In this embodiment, the stud 74 could be driven to rotate. The stud 74 could be a ball screw. When the stud 74 rotates, it will drive the bushing 721 moving upwardly and downwardly, so that the driving block 72 will also move upwardly and downwardly. Because the driving block 72 is connected to the topmost couple plate 50, when the stud 74 rotates (either clockwise or counterclockwise) and moves the driving block 72 upwardly, the driving block 72 will pull the topmost couple plate 50 so as to stretch the plurality of the connecting side walls 71 accordingly, as a result the distance between each couple plate 50 increases. In the opposite, when the stud 74 rotates (either clockwise or counterclockwise) and moves the driving block 72 downwardly, the driving block 72 will press the topmost couple plate 50 so as to compress the plurality of the connecting side walls 71 accordingly, as a result the distance between each couple plate 50 decreases. Because the driving block 72 is moved by the rotation of the stud 74, in such condition, the elastic unit 73 with elastic force does not need to provide upward or downward elastic restoring force to driving block 72, so it could be removed. It should be noted that the structure and principle of the stud 74 being a ball screw are not particularly different from those of the conventional means, so they will not be repeated here.

In another embodiment, the driving block 72 could move upwardly either self-powered or by other external force, in this situation, the elastic unit 73 can be an extension spring. When the external force decreases or vanishes, it can provide a recovery force to move the driving block 72 downwardly. In other words, the driving block 72 could be self-powered to move upwardly or by other external force, so as to increase the distances between couple plates 50, and when the driving block 72 moves downwardly by the elastic recovery force of the extension spring, the distances of couple plates 50 decrease.

In another embodiment, the driving block 72 could move downwardly either self-powered or by other external force, in this situation, the elastic unit 73 can be a compression spring. When the external force decreases or vanishes, it can provide a recovery force to move the driving block 72 upwardly. In other words, the driving block 72 could be self-powered to move downwardly or by other external force, so as to increase the distances between couple plates 50, and when the driving block 72 moves upwardly by the elastic recovery force of the extension spring, the distances of couple plates 50 increase. Because the driving block 72 does not move by the driving of the ball screw, therefore in this embodiment, the stud 74 and the balls 75 could be removed.

In another embodiment, the driving block 72 is capable of moving upwardly as well as downwardly either self-powered or by other external force, in other words, the driving block 72 moves upwardly either self-powered or by other external force so as to increase the distances of couple plates 50, and the driving block 72 moves downwardly either self-powered or by other external force so as to decrease the distances of couple plates 50. Because the driving block 72 is capable of moving upwardly as well as downwardly, therefore in this embodiment the elastic unit 73 could be removed. Moreover, the driving block 72 does not move by the driving of the ball screw, therefore the stud 74 and the balls 75 could also be removed.

Figure 4:
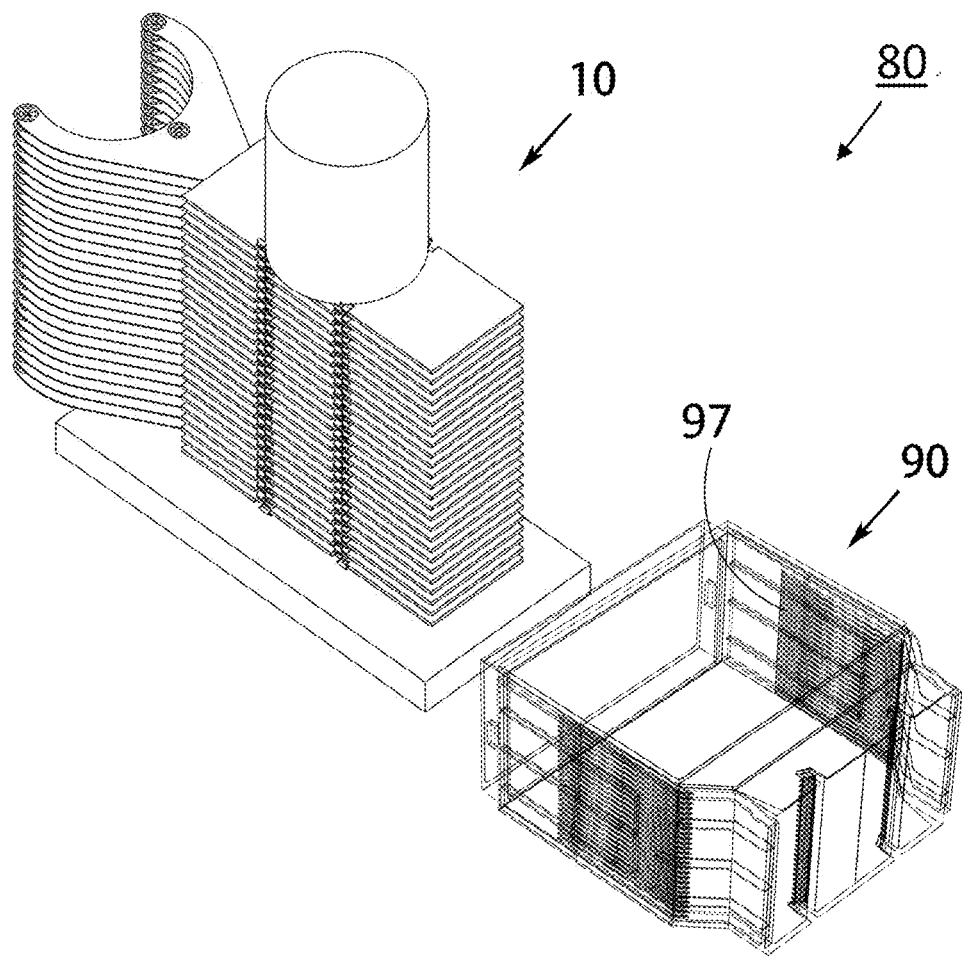
FIG. 4 is a perspective view of a wafer access assembly according to a preferred embodiment of the present invention.

Referring to FIG. 4, it illustrates a wafer access assembly 80 according to a preferred embodiment, it comprises the aforementioned wafer access device 10 and a wafer carrier 90, the wafer carrier 90 is used for the wafer access device 10 to take out or put in the wafer W. The wafer carrier 90 is mostly similar to the current structure. The wafer carrier 90 comprises a plurality of slots 97, and each slot 97 is for storing a wafer W. In this embodiment, the major difference between the wafer carrier 90 and the current structure is that the distance between two adjacent slots 97 is 5 mm. In another embodiment, the distance between two adjacent slots 97 could be greater than 3 mm (inclusive) and smaller than 10 mm (inclusive).

Figure 5:
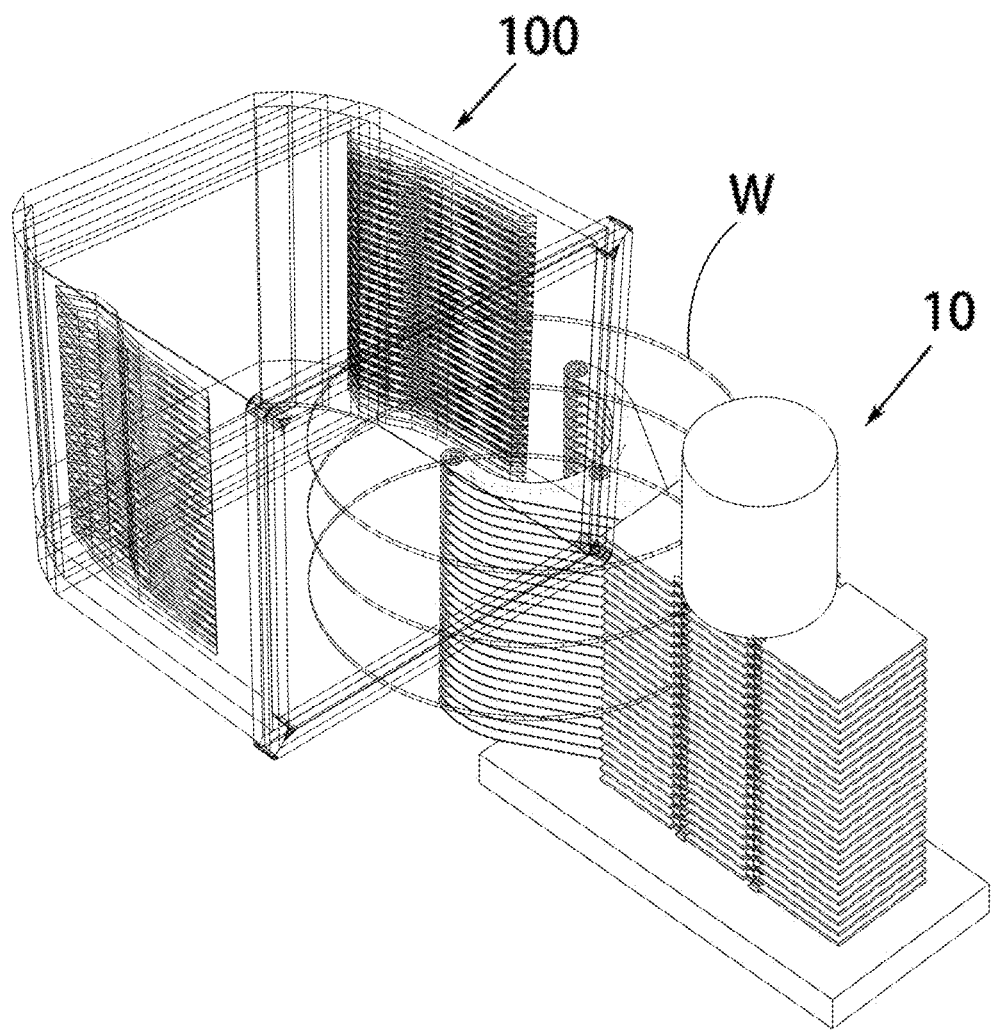
FIG. 5 is a perspective view of a current wafer carrier and a wafer access device according to a preferred embodiment of the present invention.
Figure 6:
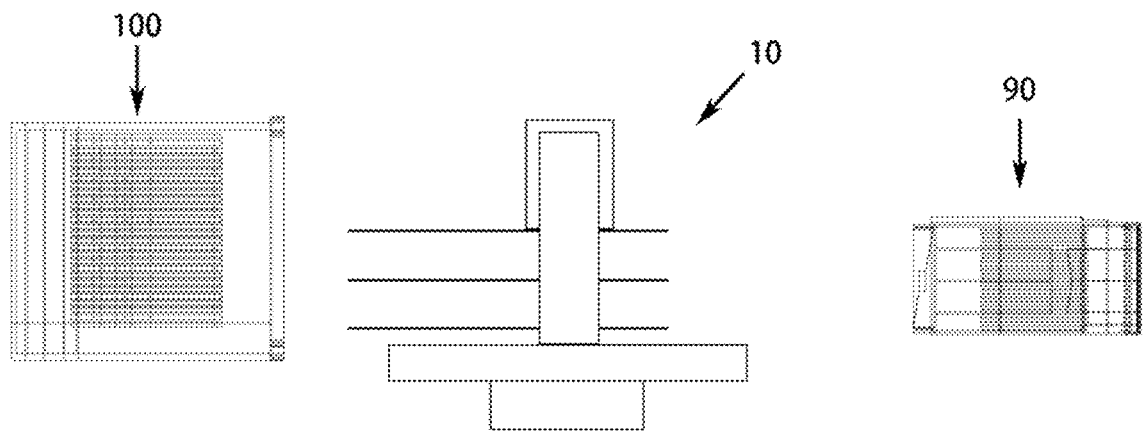
FIG. 6 to FIG. 11 are cross-sectional operational views of a wafer access device according to a preferred embodiment of the present invention.
Figure 7:
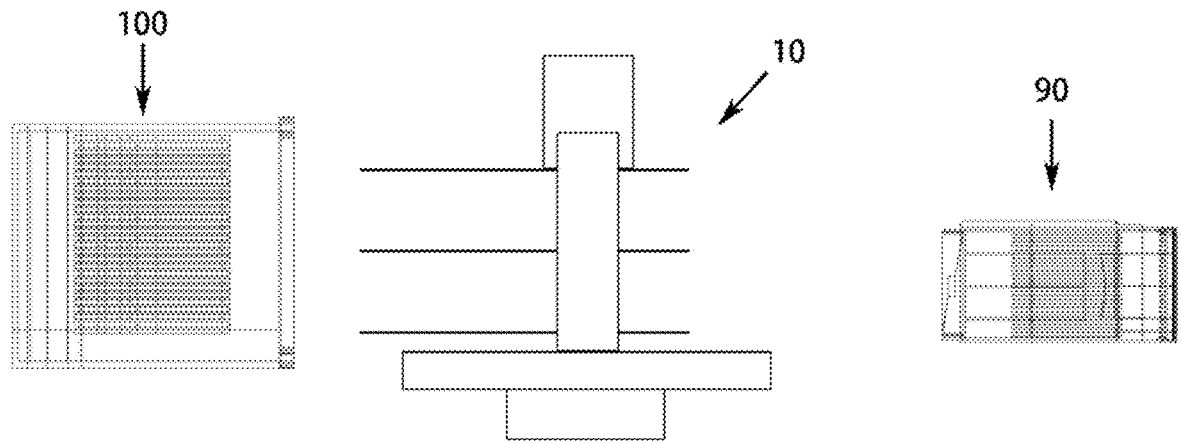
Figure 8:
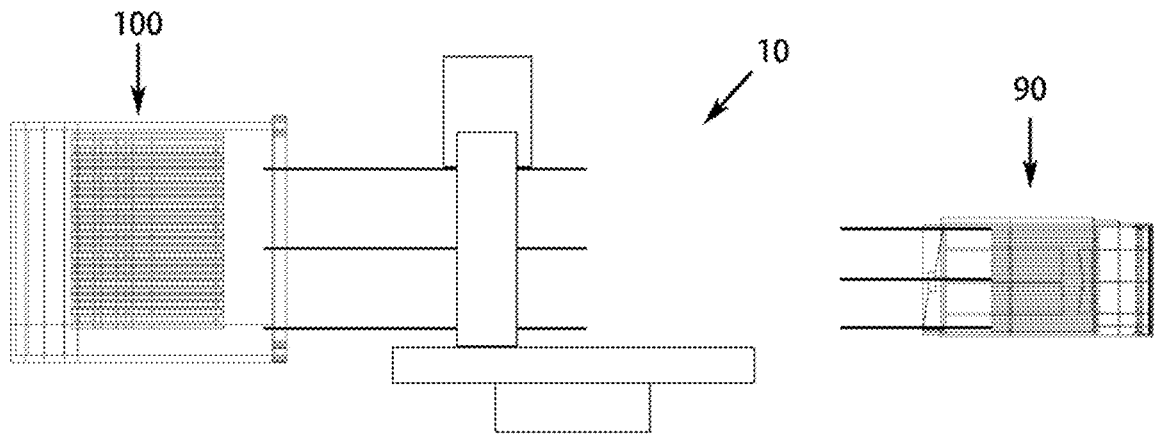
Figure 9:
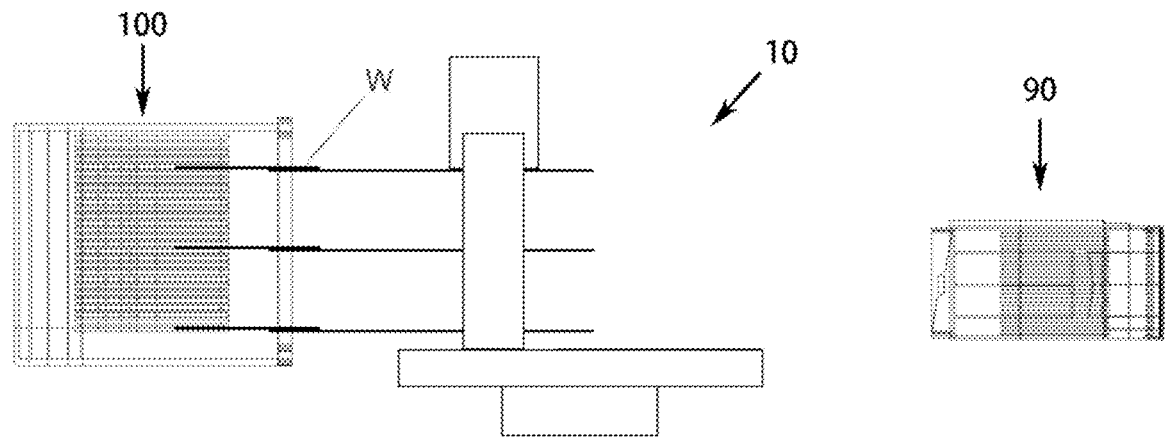
Figure 10:
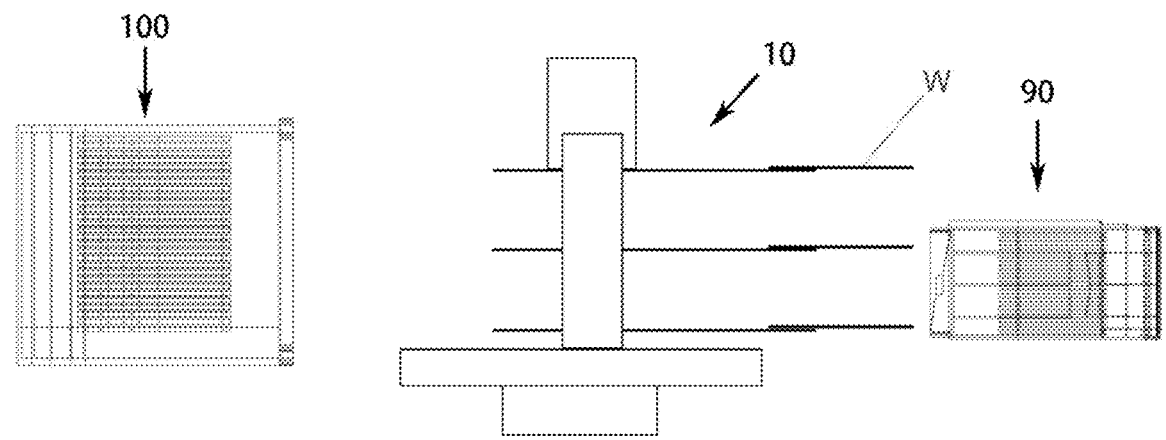
Figure 11:
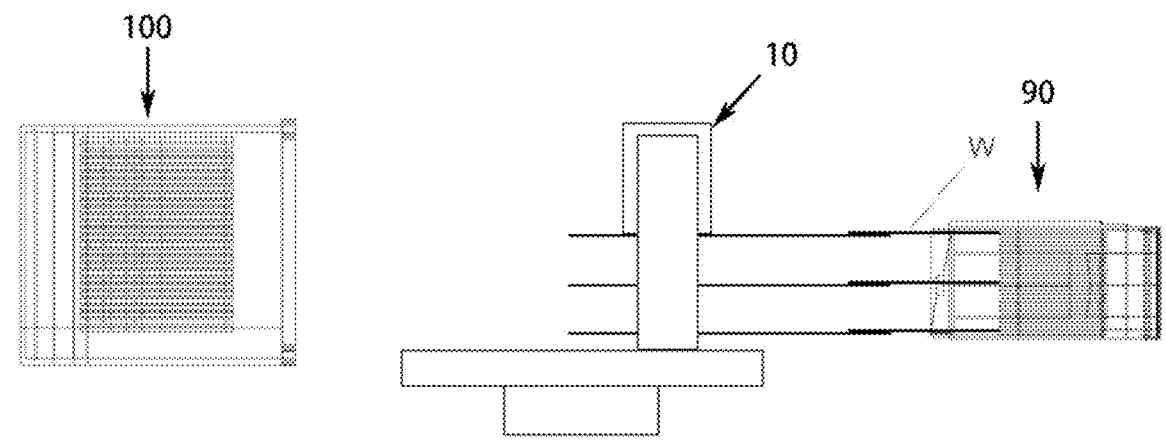

Referring to FIG. 5, the wafer carrier 100 in the left side of the figure is the conventional wafer carrier such as a wafer box or a manufacture equipment, so the description of detail structure is skipped. The conventional wafer carrier 100 can support 25 wafers, and the distance between each wafer is 10 mm. For easier describing and simplified figure, the number of wafers in the drawings is 3 as an example. The following is further description of the process for the wafer access device 10 taking the wafer 10 out from and putting into the wafer carrier 90.

Referring to FIG. 6 to 11, firstly, the wafer access device 10 is located between the conventional wafer carrier 100 and the wafer carrier 90, and a first end 321 of the groove 32 of the base 30 is closer to the conventional wafer carrier 100, a second end 323 is closer to the wafer carrier 90, and the distance between each couple plate 50 is 5 mm. Then, the driving block 72 can start to move upwardly and pull the topmost couple plate 50 and drive the plurality of connecting side walls 71 to extendedly stretch, so that the distance between each couple plate 50 is increased to 10 mm and match the structure of the current wafer carrier 100. At this time, the shaft 40 begins to shift and slide along the groove 32 toward the first end 321. While the shaft 40 shifts and slides, it will drive the plurality of couple plates 50 and the plurality of arms 60 to move toward the wafer carrier 100 together. Each arm 60 extends into the conventional wafer carrier 100 and vacuum absorb a wafer W respectively, then, the shaft 40 slides along the groove 32 toward the second end 323. At this time, the plurality of arms 60 and the absorbed wafers W also move out from the conventional wafer carrier 100. Then, the base 30 rotates in place so that the plurality of arms 60 and the absorbed wafers W shift toward the wafer carrier 90. The driving block 72 can begin to move downwardly to stick the topmost couple plate 50 so as to compress the plurality of connecting side walls 71, such that the distance between each couple plate 50 is decreased to 5 mm, that means the distance between each wafer W is 5 mm. Then the plurality of arms 60 could extend into the wafer carrier 90 and place the vacuum absorbed wafers W into the plurality of slots 97 respectively. Then, the base 30 can shift away from the wafer carrier 90 to drive the plurality of arms 60 to leave the wafer carrier 90. Therefore, the process for the wafer access device 10 taking the wafer out from the conventional wafer carrier 100 and putting into the wafer carrier 90 is completed.

Because the distance between the two adjacent slots 97 of the wafer carrier 90 is 5 mm, the distance between each wafer W within the wafer carrier 90 is only 5 mm. Therefore as compared to the conventional structure, the volume of the wafer carrier 90 for holding 25 wafers in the invention can be greatly reduced by 50%, especially for a large quantity of wafers need to be transported between factories, the occupied storing volume is also only half of the conventional art. The storage access device 10 can decrease the distance between each wafer W from 10 mm to 5 mm rapidly with ease and achieve the purpose of reducing storage volume occupied; on the other hand, because the wafer access device 10 comprises a plurality of arms 60, more specifically the wafer access device 10 can comprise 25 arms 60, it can vacuum absorb twenty five wafers for transportation in the same time. As compared to the conventional art that the conventional robot arm can only absorb one wafer at a time, the wafer access device 10 of the present invention can save plenty time of vacuum absorption and transportation of wafers, so as to achieve higher wafer access efficiency. Moreover, the wafer access device 10 can be used for objects other than the semiconductor wafers or other fields. For example, the wafer access device 10 can be used to access expander rings, masks, or glass substrates in the display industry. The present invention shall not be limited for use of semiconductor wafers. Although the disclosure has been described in detail with reference to the foregoing embodiments, a person of ordinary skill in the art should understand that modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

The invention claimed is:

1. A wafer access device comprising:
a base, comprising a groove;
a shaft extending into the groove and being capable of sliding in the groove;
a plurality of couple plates mounting on the shaft, each of the plurality of couple plates comprising a plate body and a through hole on the plate body for the shaft passing through;
a plurality of arms, each of the plurality of arms being extended from an end of each of the plurality of couple plates; and
a stretchable component, comprising a plurality of connecting side walls connecting together the adjacent couple plates, the plurality of connecting side walls being capable of changing a distance between adjacent couple plates;
wherein the stretchable component comprises a driving block set on the shaft and movable upwardly and downwardly, the driving block connected to a topmost couple plate and driving the topmost couple plate to move upwardly and downwardly; and
wherein the stretchable component comprises a stud being accommodated within the shaft, the driving block comprises a bushing, the bushing extending into the shaft and between the shaft and the stud, wherein the stud rotates to move the driving block upwardly and downwardly.

2. The wafer access device according to claim 1, wherein the stretchable component comprises an elastic unit set inside the shaft and sticking to the driving block.

3. The wafer access device according to claim 2, wherein the elastic unit is a compressed spring providing a recovery force for moving the driving block upwardly.

4. The wafer access device according to claim 2, wherein the elastic unit is an extension spring providing a recovery force for moving the driving block downwardly.

5. The wafer access device according to claim 1, wherein the stretchable component comprises an elastic unit set inside the shaft and sticking to the driving block.

6. The wafer access device according to claim 1, wherein the stretchable component comprises a plurality of balls set in between the bushing and the stud.

7. A wafer carrier for transporting a wafer in and out by the wafer access device of claim 1, wherein the wafer carrier comprises a plurality of slots.

8. The wafer carrier according to claim 7, a distance between two adjacent slots is in a range between 3 mm to 10 mm.

9. The wafer carrier according to claim 8, a distance between two adjacent slots is 5 mm.

10. A wafer access assembly capable of transporting a wafer, comprising:
the wafer access device according to claim 1; and
the wafer carrier, wherein the wafer carrier comprises a plurality of slots;
wherein the wafer access device transports the wafer to and from the wafer carrier.

\* \* \* \* \*